United States Patent
Anderson et al.

(10) Patent No.: US 11,451,047 B2
(45) Date of Patent: Sep. 20, 2022

(54) PROTECTION OF ELECTRICAL DEVICES BASED ON ELECTROMAGNETIC PULSE SIGNAL

(71) Applicant: TechHold, LLC, Champlin, MN (US)

(72) Inventors: David Anderson, Excelsior, MN (US); Greg Fuchs, River Falls, WI (US); Frederick R. Faxvog, Medina, MN (US)

(73) Assignee: TechHold, LLC, Minneapolis, MN (US)

( * ) Notice: Subject to any disclaimer, the term of this patent is extended or adjusted under 35 U.S.C. 154(b) by 746 days.

(21) Appl. No.: 15/942,020

(22) Filed: Mar. 30, 2018

(65) Prior Publication Data

US 2019/0036326 A1    Jan. 31, 2019

Related U.S. Application Data (60) Provisional application No. 62/514,263, filed on Jun. 2, 2017, provisional application No. 62/479,151, filed on Mar. 30, 2017.

(51) Int. Cl.
| | |
|---|---|
| *H02H 7/04* | (2006.01) |
| *H02H 1/00* | (2006.01) |
| *H02H 3/22* | (2006.01) |
| *G01R 29/08* | (2006.01) |

(Continued)

(52) U.S. Cl.
CPC ............ *H02H 7/04* (2013.01); *H02H 1/0007* (2013.01); *H02H 3/22* (2013.01); *G01R 29/0814* (2013.01); *H02H 3/50* (2013.01); *H02H 9/005* (2013.01)

(58) Field of Classification Search
CPC ............ H02H 3/22; H02H 3/50; H02H 9/005; H02H 1/0007; H02H 7/04; G01R 29/0814
See application file for complete search history.

(56) References Cited

U.S. PATENT DOCUMENTS

| | | | |
|---|---|---|---|
| 3,619,723 | A | 11/1971 | Walden |
| 3,916,261 | A | 10/1975 | Zylstra et al. |
| 4,153,891 | A | 5/1979 | McNutt |

(Continued)

FOREIGN PATENT DOCUMENTS

| | | |
|---|---|---|
| EP | 0 240 783 A1 | 10/1987 |
| GB | 2 347 225 A | 8/2000 |

(Continued)

OTHER PUBLICATIONS

Bolduc, L. et al., "Development of a DC Current-Blocking Device for Transformer Neutrals," IEEE Transactions on Power Delivery, vol. 20, No. 1, pp. 163-168 (Jan. 2005).

(Continued)

*Primary Examiner* — Jue Zhang
(74) *Attorney, Agent, or Firm* — Merchant & Gould P.C.

(57) ABSTRACT

A circuit includes a detector and controller circuit configured to detect a high field RF (radio frequency) electromagnetic fields indicating a potential of an electromagnetic pulse event capable of damaging electrical equipment connected to a power grid. The circuit also includes controller receiving an input from the detector circuit, the controller being included within a shielded enclosure and configured to initiate an event in response to detection of the high field electromagnetic pulse field to remove the electrical equipment from the power grid.

25 Claims, 7 Drawing Sheets

(51) Int. Cl.
*H02H 9/00* (2006.01)
*H02H 3/50* (2006.01)

(56) References Cited

U.S. PATENT DOCUMENTS

| | | |
|---|---|---|
| 4,297,738 A | 10/1981 | Lee |
| 4,507,703 A | 3/1985 | Blau et al. |
| 4,580,186 A | 4/1986 | Parker et al. |
| 4,654,806 A | 3/1987 | Poyser et al. |
| 5,136,453 A | 8/1992 | Oliver |
| 5,179,489 A | 1/1993 | Oliver |
| 5,220,480 A | 6/1993 | Kershaw, Jr. et al. |
| 5,390,064 A | 2/1995 | Russo |
| 5,684,466 A | 11/1997 | Keating et al. |
| 5,751,530 A | 5/1998 | Pelly et al. |
| 5,930,099 A | 7/1999 | Legro et al. |
| 5,982,276 A | 11/1999 | Stewart |
| 6,144,341 A | 11/2000 | Kraz |
| 6,188,552 B1 | 2/2001 | Jaeschke et al. |
| 6,229,682 B1 | 5/2001 | Mechanic |
| 6,437,993 B1 | 8/2002 | Burgdorf et al. |
| 6,560,086 B2 | 5/2003 | Mechanic |
| 7,321,291 B2 | 1/2008 | Gidge et al. |
| 7,529,069 B1 | 5/2009 | Weems, II et al. |
| 7,541,995 B1 | 6/2009 | Murphy, Jr. |
| 7,589,943 B2 | 9/2009 | Ramirez et al. |
| 7,598,857 B1 | 10/2009 | Reagan et al. |
| 7,945,213 B2 | 5/2011 | Sulkowski, Jr. et al. |
| 7,969,696 B2 | 6/2011 | Lazarovich et al. |
| 8,035,935 B2 | 10/2011 | Ramirez et al. |
| 8,537,508 B2 | 9/2013 | Faxvog et al. |
| 8,547,710 B2 | 10/2013 | Ruehl et al. |
| 8,642,900 B2 | 2/2014 | Nordling et al. |
| 8,760,859 B2 | 6/2014 | Fuchs et al. |
| 8,773,107 B2 | 7/2014 | Jackson et al. |
| 8,860,402 B2 | 10/2014 | Jackson et al. |
| 8,878,396 B2 | 11/2014 | Faxvog et al. |
| 9,077,172 B2 | 7/2015 | Faxvog et al. |
| 9,564,753 B2 | 2/2017 | Faxvog et al. |
| 10,199,821 B2 | 2/2019 | Fuchs et al. |
| 10,931,096 B2 | 2/2021 | Fuchs et al. |
| 10,985,559 B2 | 4/2021 | Anderson et al. |
| 2001/0040458 A1 | 11/2001 | MacBeth et al. |
| 2007/0217103 A1 | 9/2007 | AF Klercker Alakula et al. |
| 2008/0179945 A1 | 7/2008 | Linebach et al. |
| 2008/0232006 A1 | 9/2008 | Ramirez et al. |
| 2009/0147415 A1 | 6/2009 | Lazarevich et al. |
| 2010/0007354 A1 | 1/2010 | Deaver, Sr. et al. |
| 2010/0046129 A1 | 2/2010 | Mikrut |
| 2010/0097734 A1 | 4/2010 | Birnbach |
| 2010/0195256 A1 | 8/2010 | Birnbach |
| 2011/0089929 A1 | 4/2011 | Jackson et al. |
| 2011/0092181 A1 | 4/2011 | Jackson et al. |
| 2012/0019962 A1 | 1/2012 | Faxvog et al. |
| 2012/0019965 A1 | 1/2012 | Faxvog et al. |
| 2013/0285671 A1 | 10/2013 | Hoffman et al. |
| 2013/0308229 A1 | 11/2013 | Faxvog et al. |
| 2014/0008119 A1* | 1/2014 | Brandt ................ H05K 9/0073 174/382 |
| 2015/0311697 A1 | 10/2015 | Faxvog et al. |
| 2016/0197469 A1 | 7/2016 | Fuchs et al. |
| 2016/0231367 A1* | 8/2016 | Cox ........................ G05B 9/02 |
| 2018/0145504 A1 | 5/2018 | Kovan et al. |
| 2018/0205217 A1 | 7/2018 | Fuchs et al. |
| 2018/0226796 A1 | 8/2018 | Anderson et al. |

FOREIGN PATENT DOCUMENTS

| | | |
|---|---|---|
| JP | 58-46804 A | 3/1983 |
| JP | 59-13313 A | 1/1984 |
| JP | 2-142358 A | 5/1990 |
| JP | 3-207224 A | 9/1991 |
| JP | 5-81973 A | 4/1993 |
| JP | 5-258837 A | 10/1993 |
| JP | 6-260308 A | 9/1994 |
| JP | 2001-28829 A | 1/2001 |
| JP | 2004-347563 A | 12/2004 |

OTHER PUBLICATIONS

DC Blocking Device, Siemens AG, 13 pages (Sep. 20, 2013).
International Search Report and Written Opinion for PCT/US2011/044536 dated Mar. 27, 2012.
International Search Report and Written Opinion for PCT/US2011/044658 dated Jul. 12, 2012.
International Search Report and Written Opinion for Application No. PCT/US2016/012358 dated Jun. 15, 2016.
Invitation to Pay Additional Fees with Partial International Search cited in International Application No. PCT/US2011/044536 dated Nov. 21, 2011.
Japanese Office Action for Application No. 2013-520809 dated Mar. 24, 2015.
Kappenman, et al., GIG Mitigation: A Neutral Blocking/Bypass Device to Prevent the Flow of GIC in Power Systems, IEEE Transactions on Power Delivery, vol. 6, No. 3, 11 Pages, Jul. 1991.
Superpower Inc. ID#88 (SP-145), 10 pages, Apr. 29, 2005.
John Kappenman, Metatech (Meta-R-319) "Geomagnetic Storms and Their Impacts on the U.S. Power Grid", Metatech Corporation, Jan. 2010, 197 Pages.
Edward Savage et al., Metatech (Meta-R-320) "The Early-Time (E1) High-Altitude Electromagnetic Pulse (HEMP) and Its Impact on the U.S. Power Grid", Metatech Corporation, Jan. 2010, 168 Pages.
James Gilbert et al., Metatech (Meta-R-321) "The Late-Time (E3) High-Altitude Electromagnetic Pulse (HEMP) and Its Impact on the U.S. Power Grid", Metatech Corporation, Jan. 2010, 321 Pages.
Extended EP Search Report for 20214236.0 dated Mar. 5, 2021.

* cited by examiner

PROTECTION OF ELECTRICAL DEVICES BASED ON ELECTROMAGNETIC PULSE SIGNAL

CROSS-REFERENCE TO RELATED APPLICATIONS

The present application claims priority from U.S. Provisional Application No. 62/479,151, filed on Mar. 30, 2017, and U.S. Provisional Patent Application No. 62/514,263 filed on Jun. 2, 2017, the disclosures of each of which are hereby incorporated by reference in their entireties.

TECHNICAL FIELD

The present disclosure relates generally to electrical devices. In particular, the present disclosure relates to electromagnetic protection of electrical equipment, such as repeaters and amplifiers, as well as other power grid equipment, such as transformers, generators, circuit breakers, relays, capacitors, and series capacitors from damage by electromagnetic signals.

BACKGROUND

Damage based on exposure to electromagnetic fields can cause various types of damage to electrical systems, particularly those included in sensitive circuits such as the power grid. For example, EMP events can cause interference or damage to electrical equipment, causing that equipment to malfunction or rendering it nonoperational. In general, damaging electromagnetic events take one of two forms. First, high field events correspond to short-duration, high electromagnetic field events (e.g., up to and exceeding 100 kilovolts per meter), and typically are of the form of short pulses of narrow-band or distributed signals (e.g., in the frequency range of typically 100 Hz to 10 GHz). These types of events typically generate high voltage differences in equipment, leading to high induced currents and burnout of electrical components. Second, low field events (e.g., events in the range of 0.01 to 10 volts per meter) are indications of changing electromagnetic environments below the high field damaging environments, but still of interest in certain applications.

In particular examples, electromagnetic events that may be the result of nuclear events may cause damage to electrical equipment. In such examples, the nuclear event may include a number of different types of electromagnetic signals, including E1, E2, and E3 signal components, as defined in Electromagnetic compatibility (EMC)—Part 2: Environment—Section 9: Description of HEMP environment—Radiated disturbance. Basic EMC publication, IEC 61000-2-9, the disclosure of which is hereby incorporated by reference in its entirety. Generally, The E1 component is a brief but intense electromagnetic field that can quickly induce very high voltages in electrical conductors. The E2 component is generated, for example, by scattered gamma rays and inelastic gammas produced by weapon neutrons. The E3 component is a very slow pulse, lasting tens to hundreds of seconds, that can be caused by the nuclear detonation heaving the Earth's magnetic field out of the way, followed by the restoration of the magnetic field to its natural state. The E3 component has similarities to a geomagnetic storm caused by a coronal mass ejection (CME). Like a geomagnetic storm, E3 can produce geomagnetically induced currents in long electrical conductors, which can then damage or destroy components such as power line transformers.

Because the vast majority of electronics remain unprotected from such potentially damaging events, a widespread outage or failure of electrical equipment, including power grid components, due to electromagnetic interference could have disastrous effects.

SUMMARY

In accordance with the following disclosure, the above and other issues may be addressed by the following:

In one aspect, a circuit includes a detector circuit configured to detect a high field electromagnetic field indicating a potential of an electromagnetic event capable of damaging electrical equipment connected to a power grid. The circuit also includes a controller receiving an input from the detector circuit, the controller being included within a shielded enclosure and configured to generate an actuation signal output from the controller to take some action in response to detection of the high field electromagnetic field, thereby disconnecting the electrical equipment from the power grid or otherwise disconnecting a portion or portions of the power grid from the power grid as a whole.

In a second aspect, a method of protecting a transformer electrically connected to a power grid is disclosed. The method includes detecting, via a detection circuit, a high field electromagnetic field indicating a potential of an electromagnetic event capable of damaging electrical equipment. The method further includes, in response to detecting the high field electromagnetic field at a detection circuit, sending an actuation signal from a controller positioned within a shielded enclosure, the actuation signal triggering an action to disconnect the transformer from the power grid prior to arrival of the electromagnetic event capable of damaging electrical equipment.

In a third aspect, a circuit is disclosed that includes a detector circuit configured to detect a high field electromagnetic field indicating a potential of an electromagnetic event capable of damaging electrical equipment connected to submerged trans-oceanic fiber optic cables. The circuit further includes a controller receiving an input from the detector circuit, the controller being included within a shielded enclosure and configured to generate an actuation signal output from the controller to initiate an event in response to detection of the high field electromagnetic field to disconnect the electrical equipment from the power grid.

DETAILED DESCRIPTION

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, as briefly described above, embodiments of the present invention are directed to protection of electrical components, such as those included in a power grid, from potentially damaging electromagnetic effects. Such effects can be due to, for example, EMP events, such as may be caused by nuclear detonations, solar storms, or other large-scale events.

In example embodiments, the present disclosure allows for detection of events and disconnection and/or isolation of electrical equipment or even portions of a power grid, thereby allowing the power grid to be segmented such that separate portions may be protected. This avoids the possibility of an event that could affect a large power grid where the event is geographically isolated in one section of the power grid.

Figure 1:
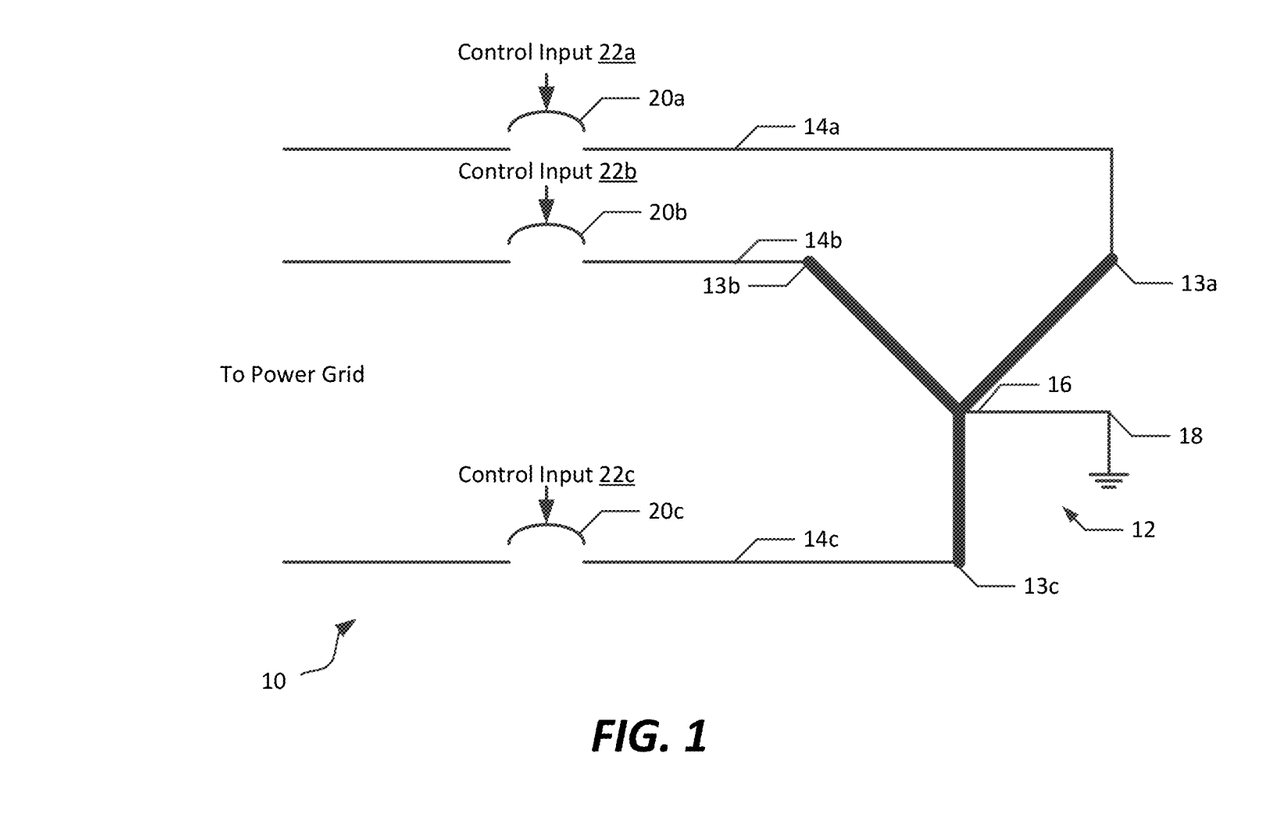
FIG. 1 illustrates a circuit illustrating electrical equipment to be protected according to aspects of the present disclosure.

In one example embodiment, seen in FIG. 1, a circuit 10 is shown in association with which aspects of the present disclosure can be implemented. The circuit 10 includes electrical equipment (e.g., transformers, generators, the breakers themselves, relays, capacitors, series capacitors) connected to an electricity source. In the specific example shown, a transformer 12 is electrically connected to an electricity source, seen as a three-phase power grid line 14a-c. Each of the three phases of the power grid lines are connected to transformer phases 13a-c.

In the example shown, the neutral 16 of the transformer 12 is connected to a ground 18. In alternative embodiments, the neutral 16 of the transformer 12 can be selectively connected to ground using a protective circuit. Example protective circuits, and corresponding protective operations, are described in U.S. Pat. No. 8,878,396, entitled "Continuous uninterruptable AC grounding system for power system protection", and U.S. Pat. No. 8,537,508, entitled "Sensing and Control Electronics for a Power Grid Protection System" the disclosures of both of which are hereby incorporated by reference in their entireties.

In the example shown in FIG. 1, high voltage alternating current circuit breakers 20a-c are connected at each of the grid lines 14a-c leading to the transformer phases 13a-c. The breakers 20a-c are normally closed, ensuring that the transformer 12 is connected to the power grid. However, control inputs 22a-c are useable to electrically actuate the breakers 20a-c to an open position, thereby removing the transformer 12 from the power grid. By removing, it is intended that the transformer 12, or other electrical component according to various other embodiments, is electrically disconnected or isolated from other portions (e.g., electrically adjacent portions) of the power grid.

Figure 2:
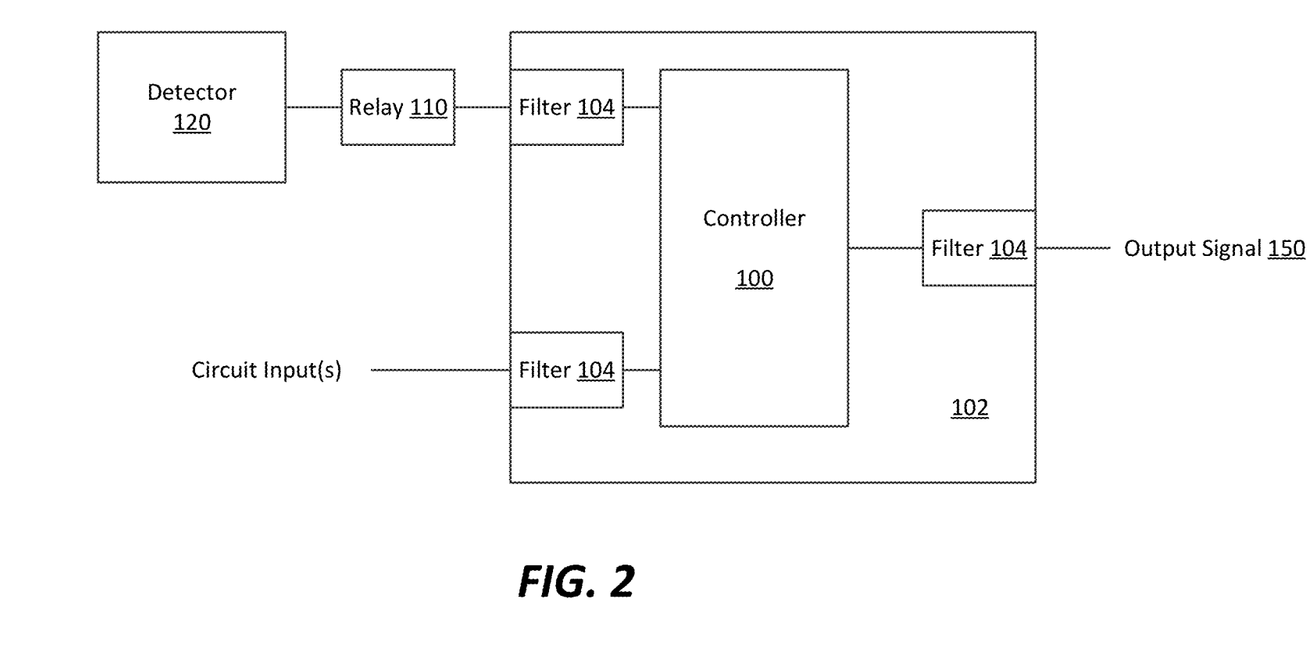
FIG. 2 illustrates an example protection controller useable in connection with the present disclosure.

Referring now to FIG. 2, a control circuit useable to actuate the control inputs 22a-c is shown. The control circuit includes a controller 100 positioned within a shielded enclosure 102, which is configured to shield from electromagnetic effects. The controller is communicatively connected to a detector 120 via a relay 110. The detector generally is configured to detect electromagnetic signals that may be indicative of a possible harmful electromagnetic event. The relay 110 can selectively connect or disconnect the detector. One example detector useable in the context of the present disclosure is described in U.S. Pat. No. 8,860,402, entitled "Electromagnetic field detection systems and methods", the disclosure of which is hereby incorporated by reference in its entirety. In example embodiments, the circuitry components of the detector 120 can be included within a shielded enclosure as well.

In example embodiments, the detector 120 can be programmable to sense a particular level of a signal that is indicative of a subsequently-received, potentially damaging signal. For example, the detector 120 can be adjustable to various levels of E1 or E2 signals which may be indicative of a subsequent E3 signal component (and corresponding substantial DC or quasi-DC current) that would place the electrical equipment at risk of damage. Furthermore, more than one detector could be used at different threshold levels to trigger disconnection of different electrical equipment, either via the same controller 100 or different controllers.

In example embodiments, the controller 100 can be a programmable controller configured to execute instructions. For example, the controller 100 can be any of a variety of ASIC or programmable logic controllers, and can include a memory configured to store operational code that, when executed, performs an algorithm for detection of potentially damaging signals, and generates an event signal in response (such as by actuating a switch, or otherwise isolating an electrical component from the power grid).

In an example embodiment, the controller 100 can be configured to detect an E1 signal component over a particular threshold and then detect an E2 signal component over a second particular threshold. The controller can be configured to, based on detection of E1 and/or E2 signal components, initiate an action such as actuating a switch (e.g., a circuit breaker). This will prevent the controller from actuating the switch or otherwise isolating an electrical component in the event of only E1 signal detection, which may be the case if a non nuclear RF signal were received rather than a potentially damaging nuclear event signal. In other words, if E1 is received but not E2, it can be assumed that no E3 component might be received, and therefore there is little likelihood of damage to a power grid, so there may be no reason to isolate the portion of the power grid to which the circuit is connected.

In still further embodiments, a further electrical input, for example a voltage or current sensor input, can be included as well. In particular, in the example shown, the input to the controller 100 through the enclosure 102 is protected by filters 104. Similarly, an output signal 150 exits the enclosure 102 as protected by a filter 104. The output signal 150 can be, in various embodiments, output to one or more of the control inputs 22a-c of the breakers 20a-c, or to other sets of breakers associated with other electrical equipment. Furthermore, more than one output signal could be output from the controller. Accordingly, in various embodiments, a plurality of electrical equipment such as transformers could be disconnected from an electrical source (e.g., the power grid) upon detection of a harmful event, or different types of electrical equipment could be triggered to be disconnected at different times, or at different signal levels. Examples of such an enclosure are described in U.S. Pat. Nos. 8,642,900 and 8,760,859, the disclosures of each of which are hereby incorporated by reference in their entireties. Furthermore, the control circuit, and controller 100, can be implemented analogous to that disclosed in U.S. Pat. No. 8,537,508, entitled "Sensing and Control Electronics for a Power Grid Protection System", previously incorporated by reference.

In specific examples, the transformer 12 can be disconnected from the power grid in response to various detected signals. For instance, the detector 120 can be configured to detect the E1 component of nuclear HEMP, which arrives 1-3 seconds before the E3 component. In response, the controller 100, which is protected from damage by the E1 or other signals by the enclosure 102, can be triggered to open the breakers 20a-c immediately, and thereby remove the transformer 12 from the power grid and prevent it from being damaged. In other examples, other circuit inputs can be triggered. For example, multiple such detectors could be integrated and the breakers only triggered upon the signal exceeding a threshold of all or some plurality of detectors. Furthermore, the breakers 20a-c may be opened based on experiencing of other signals, such as a DC or harmonic signal indicative of a potential damaging effect on the electrical equipment.

This has the effect of taking the transformer (or generator or other electrical equipment) off line before geomagnetically induced current (GIC) or quasi-DC current (as part of the E3 component) arrives. Waiting until quasi-DC current is sensed after the arrival of the first E3 component may be problematic from a protection standpoint in some scenarios, because a first E3 component in the case of nuclear HEMP has a fast rise time that causes quasi-DC current to increase to such a high level before the breakers can open that they may be unable to break the current (high quasi-DC vs AC current and no zero crossings). Accordingly, the breakers 20a-c are triggered on the earlier-occurring E1 event, in such scenarios. If the breakers 20a-c were not opened until the E3 event, the inability to break the current in a timely manner means the contacts will arc, destroying the breakers in less than 3 seconds.

The high quasi-DC currents caused by the E3 component can directly impact equipment such as the high voltage breakers and transformers where quasi-DC current can interfere with the normal operation and potentially damage equipment. The high quasi-DC current can also indirectly impact equipment. When the quasi-DC current flows through the transformer core, it causes half-cycle saturation and power cycle harmonics on the bulk power system. This can cause mis-operation of relays and high harmonic current flow through static VAR compensation capacitors, series capacitor banks, and generators.

Opening high voltage alternating current breakers 20a-c on the transformer (and generators) effectively shuts down the power system and eliminates the negative impacts from the quasi-DC current caused by E3.

Figure 3:
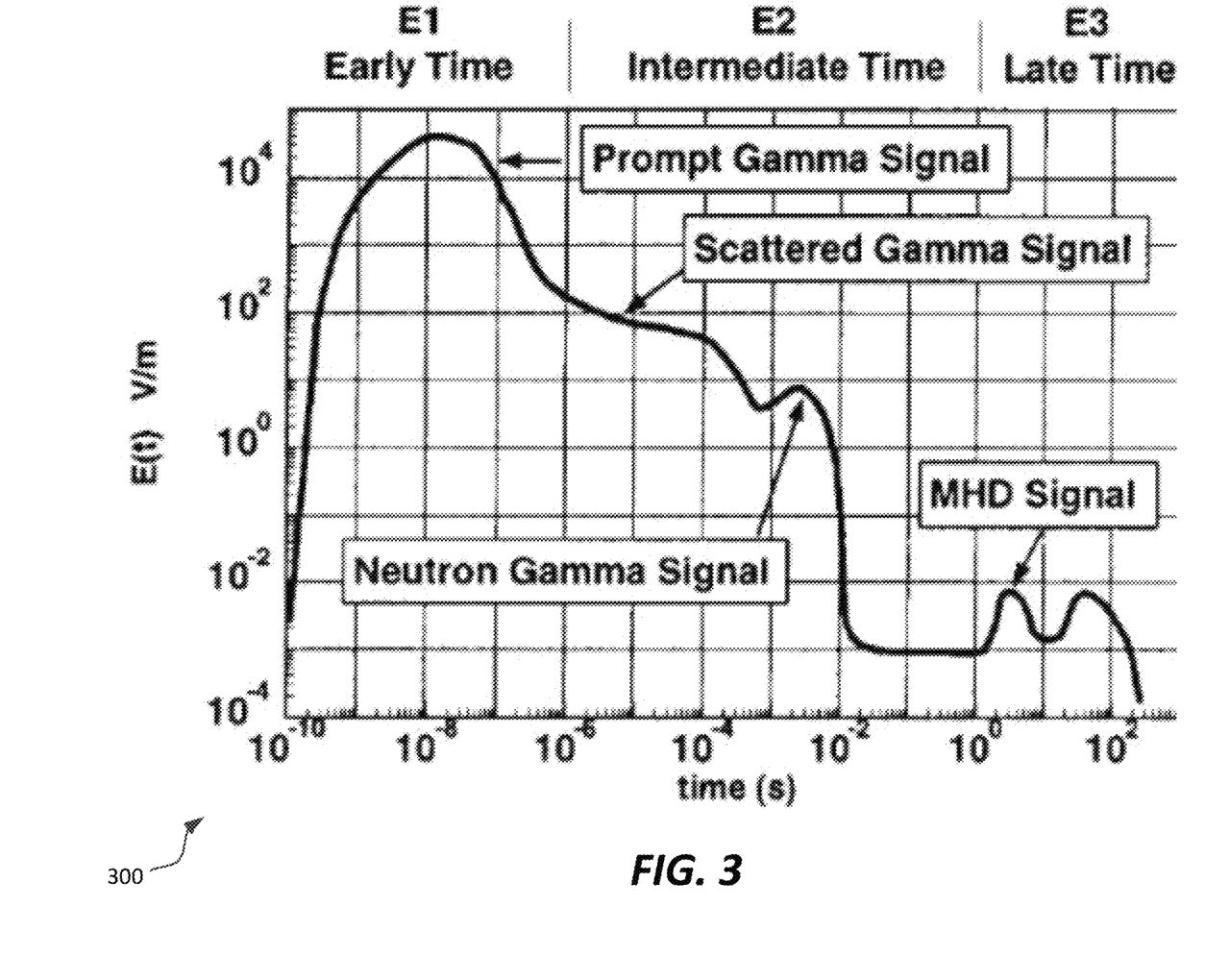
FIG. 3 is a graph illustrating signal EMP components (E1, E2 and E3 pulses) of an electromagnetic pulse (EMP) event.
Figure 4:
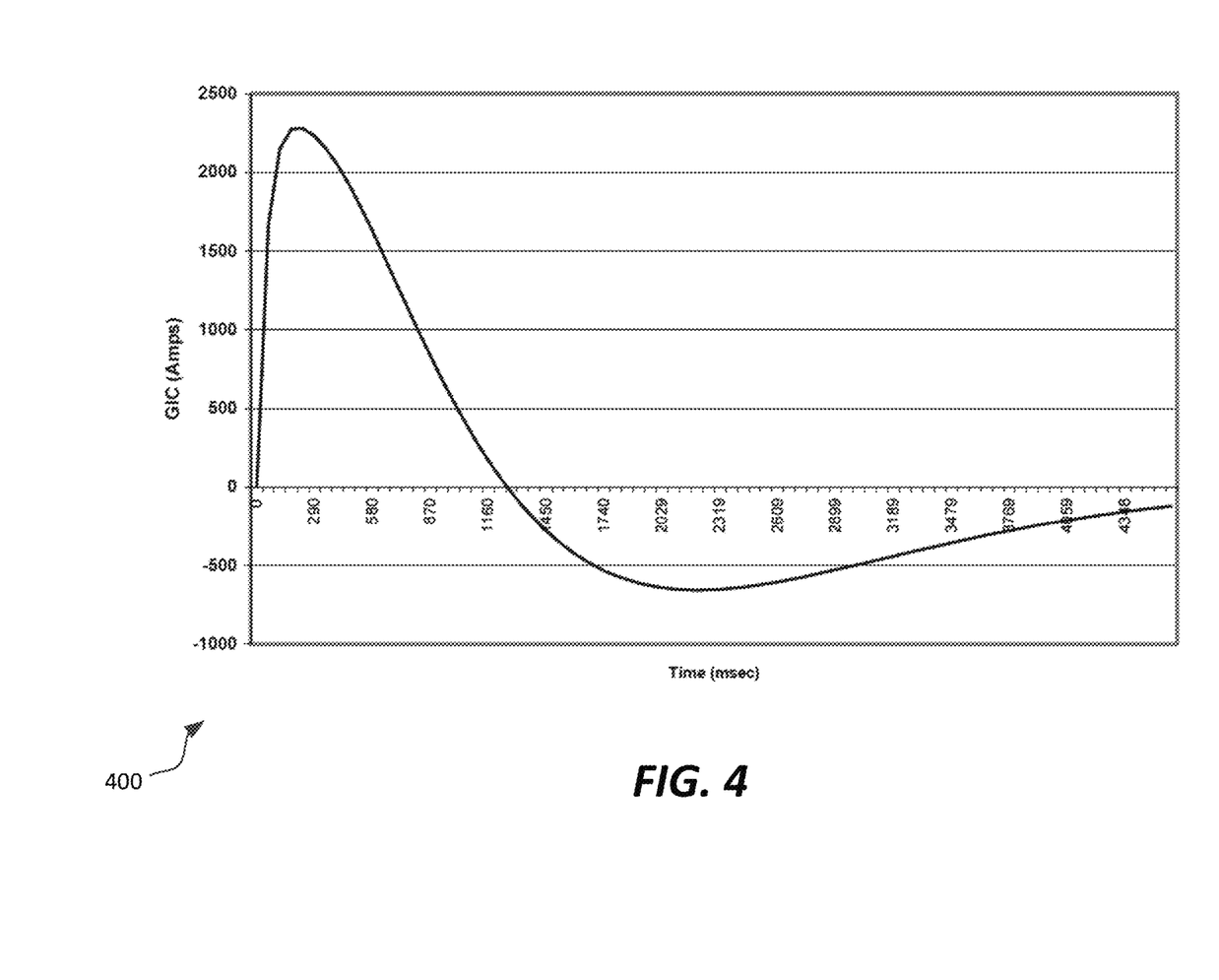
FIG. 4 is a graph showing an example rise time of a GIC induced current in a power line due to an EMP-E3 event.

Referring now to FIGS. 3-4, example electromagnetic signals that can be addressed using aspects of the present disclosure are described. FIG. 3 illustrates a graph 300 that depicts magnitudes and times at which signal components arrive from an EMP event. As illustrated in the graph 300 (and as discussed above), E1, E2, and E3 signal components are shown. As illustrated, the E1 component has a highest, shortest duration electric field strength, typically formed by initial gamma signals. The E1 component can cause electrical damage in isolated, sensitive electronic equipment, and as such, typically herein control electronics are shielded from E1 events using a shielded enclosure, as noted above. The E2 component, received in the range of milliseconds to seconds after an initial EMP event, has generally lower electric field strength, but is of longer duration than E1. The E2 pulse is similar to a lightning strike and is usually mitigated in power systems using surge arresters on the high voltage lines. Finally, the E3 signal may be received on the order of seconds after the EMP event will occur, and although it has a lower electric field magnitude, its duration allows it to induce such quasi-DC currents capable of causing damage to electrical components, particularly in the power grid.

FIG. 4 illustrates a graph 400 of an example overall GIC effect of a particular example GIC event on a portion of the power grid. As illustrated in the graph 400, the induced current experienced on the power grid will rise sharply immediately upon receiving the event, and in the example shown, peak within a few hundred milliseconds after the event. After that peak, the induced current drops and a current zero-crossing occurs, with a later induced current being of an opposite direction to the original current, and persisting for a long period (hence, forming a quasi-DC signal). Accordingly, this long duration current will also potentially cause damage to electrical components of the power grid. As such, separation, and isolation of portions of the power grid even after the long quasi-DC portion of the GIC signal can be important to preserve such power grid components.

Overall, it is recognized that various embodiments of the present disclosure provide a number of advantages with respect to circuit protection, particular with respect to electrical equipment that is possibly exposed to electromagnetic events that could be damaging, such as during a nuclear HEMP event. This also supplements the otherwise-late tripping of utility power system relays, by triggering disconnection of power system components in advance of potentially dangerous signals, rather than waiting for those signals to arrive. This in turn avoids the partial or total collapse of a power grid in the event of GIC or EMP events.

Still further, although designed such that the present circuit could be used as a solution to protect against such potential harmful effects, it could also be used in conjunction with the circuits illustrated in U.S. Pat. No. 8,878,396, entitled "Continuous uninterruptable AC grounding system for power system protection" which was previously incorporated by reference in its entirety.

As noted above, the power grid and electrical component isolation techniques described herein may be useful in segmenting a power grid into regions, such that each region may be separable upon a determination that a potentially-harmful electromagnetic event has occurred. This selective segmentation of a power grid also reduces the size of electrical components that may be required in the protection circuits described in U.S. Pat. No. 8,878,396, when such systems are used in conjunction with one another.

In accordance with the present disclosure, it is apparent that, in some cases, selection of locations of a circuit such as circuit 10 can be made throughout a power grid, and particularly to isolate, or disconnect, areas of the power grid most likely to experience high GIC-induced currents. Such locations can be identified in a number of ways. For example, historical data regarding induced currents or damage experienced to the power grid, to the extent tracked, could be used to identify areas where disconnection of electrical components may be useful. In other implementations, a current power grid can be modeled, and the effect of geomagnetically induced currents at different locations in the power grid could be simulated. Based on the results of such simulations, locations can be identified at which a greatest GIC current, and in particular a greatest potential E3 current, may reside. Those locations within the power grid may be selected and isolated using installation of circuits such as that disclosed herein.

Figure 5:
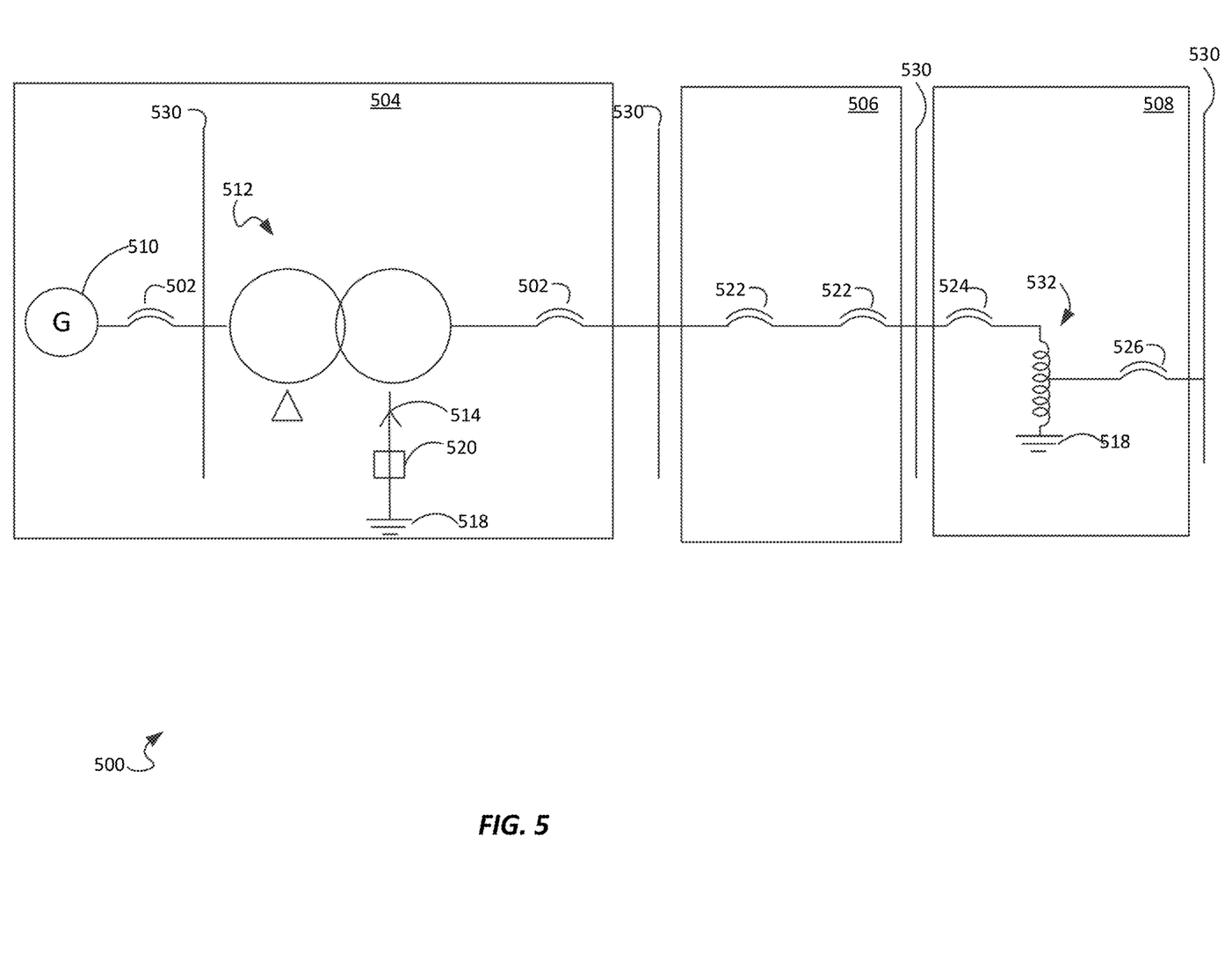
FIG. 5 is a schematic view of a power grid in which aspects of the present disclosure can be implemented.

Referring now to FIG. 5, a schematic diagram of a portion of the power grid 500 is shown that illustrates the primary power components of a high voltage (HV) or extra high voltage (EHV) electrical power generation and transmission system (345 kV to 765 kV). The electrical power at generation substation 504 is generated by generator 510 and stepped up to a higher transmission voltage by generator step-up (GSU) transformer 512. Transformer 512 has a delta-wye primary to secondary configuration with neutral grounding connection 514 on the secondary wye side. FIG. 5 illustrates the three phases of transformer 512 as a single line for simplicity. High voltage breakers 502 are electrically connected to the power line phases of transformer 512. DC neutral blocking system 520 is electrically connected between transformer neutral 514 and ground 518. A power generation substation 504 is electrically connected to three-phase transmission line system 506 and includes breakers 522 on the power lines between bus bars 530. Another set of breakers 524 are electrically connected between the transmission line system 506 and the high voltage side of step-down transformer 532 at a further substation 508. Another set of breakers 526 is electrically connected between the low voltage side of step-down transformer 532 (e.g., an autotransformer) and bus bar 530 leading to the substation local transmission line system.

It is noted that the example shown, breakers may be placed in the vicinity of transformer 512, as well as the autotransformer, shown as step-down transformer 532. In either instance, monitoring of quasi-DC currents and harmonic signals on the power signal phases can be important, since detection and protection (e.g., via introduction of a DC neutral blocking circuit at the transformer) can be used in a way that ensures proper operation of the breakers included in the vicinity of such transformers.

Figure 6:
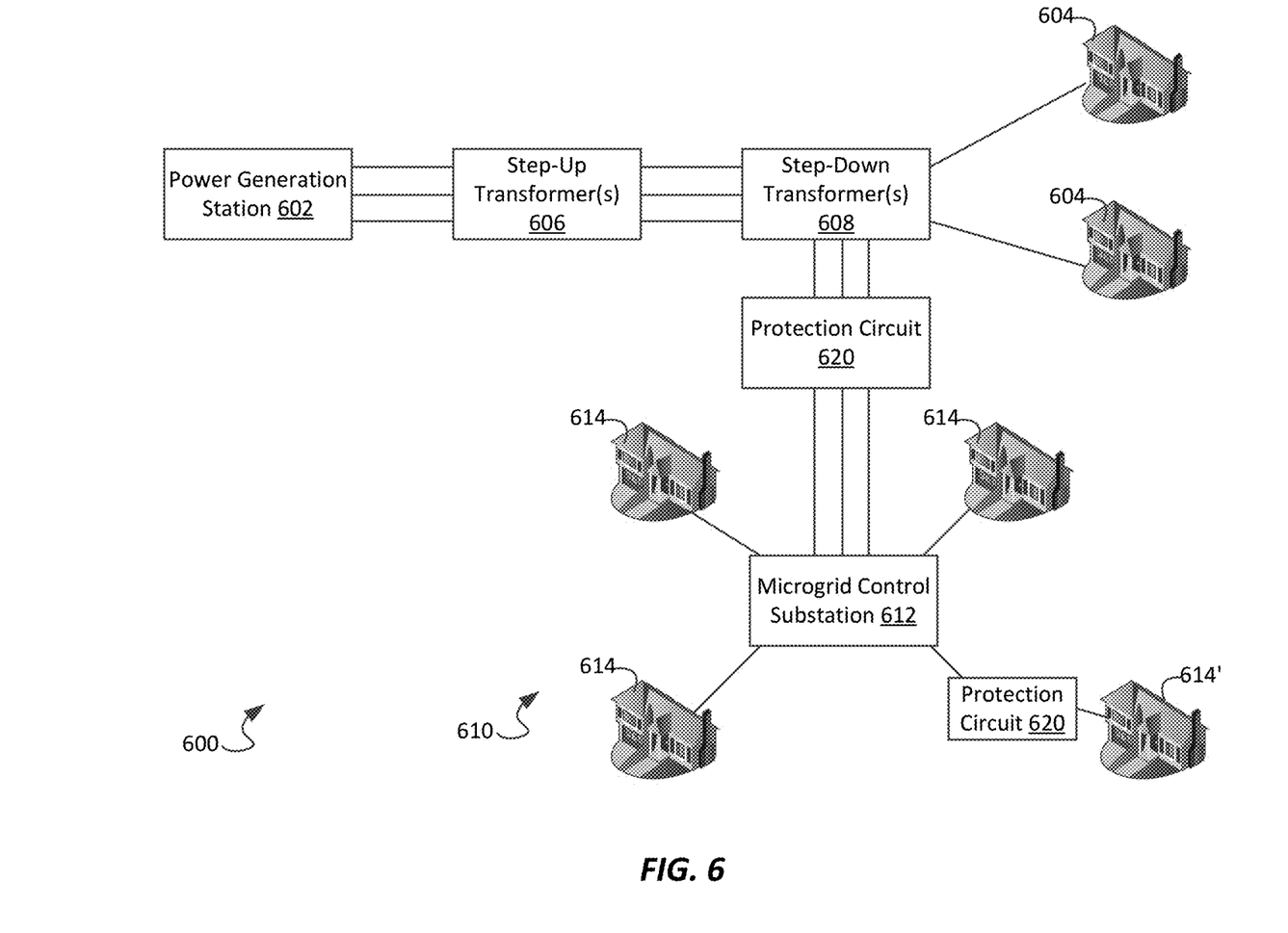
FIG. 6 illustrates a schematic view of a power grid including an example microgrid protectable according to aspects of the present disclosure.

As seen in FIG. 6, a schematic view of an example portion of a power grid 600 is shown, between a generation substation 602 and various consumer premises 604. In the example shown, a step-up transformer 606 and step-down transformer 608 can be included, and the various power phases connected to such transformers can be protected from potential damage from E3 signals based on detection of E1 and/or E2 pulses, which would have the effect of temporarily disconnecting consumers from the power grid, but would avoid damage to such transformers 606, 608 which would require substantially greater downtime. In addition one or more microgrids 610 could be included in such a power grid. The microgrid 610 can selectively disconnect from the remainder of the power grid in case of emergency or failure of the grid via protection circuit 620, and as such, could be used (1) in the event of detection of an EMP event (based on detection of E1 and/or E2 signals) to disconnect from the overall grid and remain in operation, or (2) to be separately protected by connecting a protection circuit 620 at connection points between a microgrid control station 612 and microgrid consumer premises 614 (as seen in the case of consumer 614'). In such cases, protection circuit 620 can include an electromagnetic field detector, controller, and switch (e.g., circuit breaker) as noted above.

Figure 7:
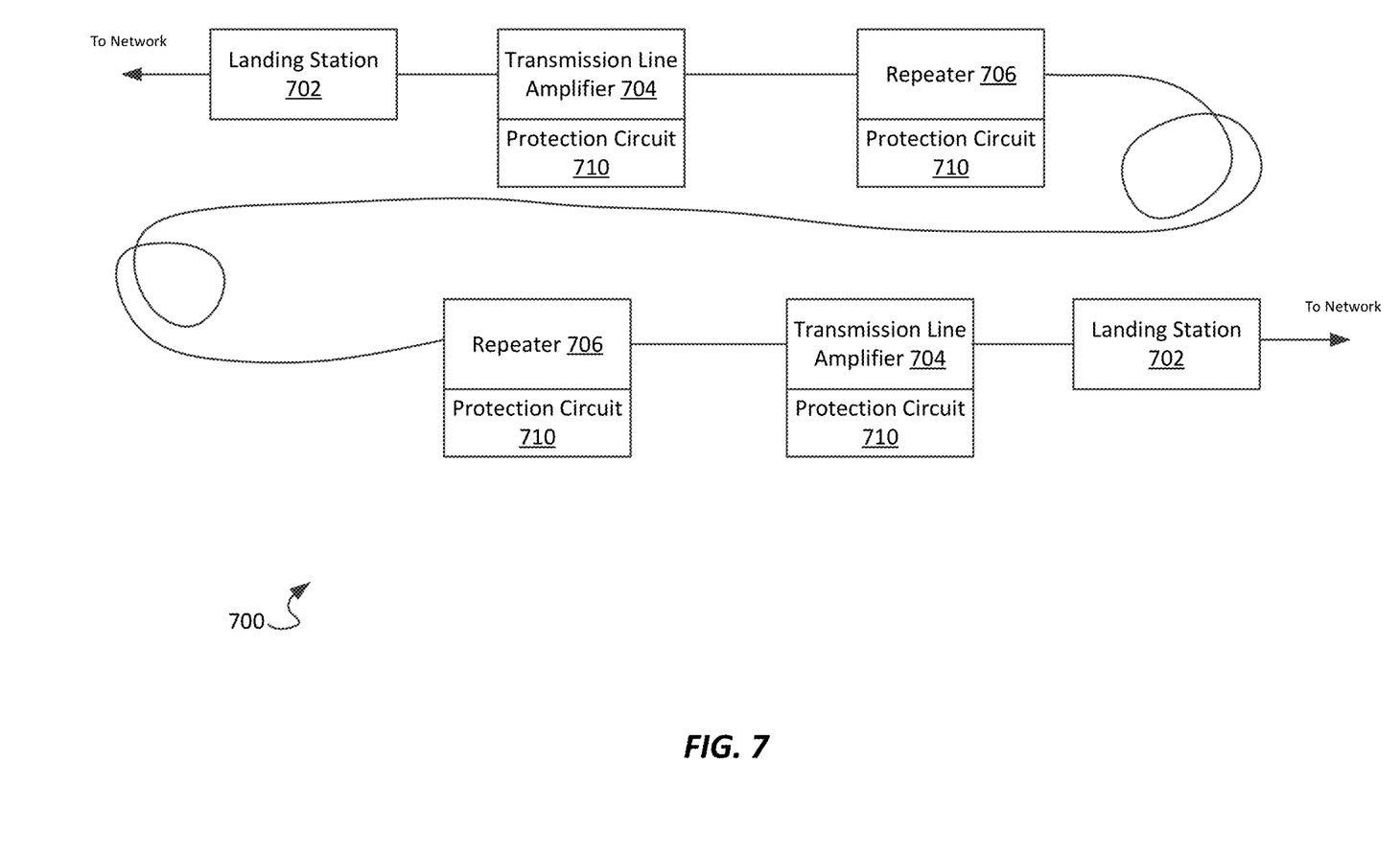
FIG. 7 is a schematic view of a telecommunications network in which aspects of the present disclosure can be implemented.

In a still further example of application seen in FIG. 7, telecommunications networks often have sensitive electrical equipment placed at exposed locations, in particular in areas where data must travel long distances. In the example shown in FIG. 7, an underwater (e.g., trans-oceanic) signal cable spans between two communications landing stations 702, and includes a transmission line amplifier 704 as well as one or more repeaters 706 or other electrical equipment (e.g., branching units, or equalizers). In accordance with the present disclosure, power at such electrical equipment can be disconnected upon detection of, e.g., E1 and/or E2 signals, via a protection circuit 710 located in proximity to such repeaters or other equipment, and electrically connected thereto so as to disconnect such repeaters in the event E1 and/or E2 signals indicative of possibly damaging E3 signals are observed. In addition, such protection circuits 610 can be located in proximity to and electrically connected at transmission amplifiers 704, for protection of those devices from potential damage as well. It is noted that, although FIGS. 5-7 represent specific examples of application of such disconnection systems, other applications are possible as well, in accordance with the present disclosure.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A circuit comprising:
   a detector circuit configured to detect an electromagnetic field indicating a potential of a future electromagnetic event capable of damaging electrical equipment connected to a power grid, the electromagnetic field comprising at least one of an E1 or E2 component of an electromagnetic pulse (EMP) signal, and the future electromagnetic event including an E3 component of the electromagnetic pulse signal;
   a controller receiving an input from the detector circuit, the controller being included within a shielded enclosure and configured to generate an actuation signal output from the controller to initiate an event in response to detection of the electromagnetic field to electrically disconnect the electrical equipment from the power grid prior to occurrence of the future electromagnetic event.

2. The circuit of claim 1, wherein the future electromagnetic event comprises E3 components of an electromagnetic pulse event caused by a nuclear high altitude blast.

3. The circuit of claim 1, wherein the controller is configured to initiate the event by actuating a control signal, the control signal switching a switch from a normally-closed position to an open position, thereby electrically disconnecting the electrical equipment from the power grid.

4. The circuit of claim 3, wherein the switch comprises a circuit breaker.

5. The circuit of claim 1, wherein, upon initiating the event, the controller causes isolation of a portion of the power grid from a remaining portion of the power grid.

6. The circuit of claim 1, wherein electrical equipment comprises a transformer.

7. The circuit of claim 6, wherein the controller is configured to actuate a plurality of switches, each switch of the plurality of switches being electrically connected between the power grid and a different phase of the transformer.

8. The circuit of claim 1, wherein the electrical equipment comprises at least one of a circuit breaker, a relay, a generator, a transmission line amplifier, a repeater, a capacitor, one or more series capacitors, or a transformer.

9. The circuit of claim 1, wherein the electromagnetic field comprises at least one of an E1 field or an E2 field of a nuclear electromagnetic pulse.

10. The circuit of claim 1, further comprising a plurality of detector circuits.

11. The circuit of claim 10, wherein the controller is configured to actuate a switch upon two or more detectors of the plurality of detectors each exceeding a respective threshold.

12. The circuit of claim 1, further comprising an output line extending from the controller to the switch.

13. The circuit of claim 12, further comprising a plurality of output lines extending from the controller to a plurality of switches.

14. The circuit of claim 13, wherein the controller is configured to actuate a plurality of actuation signals on the plurality of output lines.

15. The circuit of claim 1, wherein, by actuating the switch, the circuit avoids damage to the switch.

16. The circuit of claim 1, wherein the detector circuit configured to detect an electromagnetic field above a predetermined threshold.

17. The circuit of claim 16, wherein the predetermined threshold is adjustable in the detector circuit.

18. The circuit of claim 1, wherein the controller is configured to actuate a plurality of switches associated with a plurality of different electrical equipment of a power grid sub station.

19. The circuit of claim 1, wherein the controller executes instructions to:
measure a frequency and/or amplitude of an E1 signal component of the electromagnetic field; and
measure a frequency and/or amplitude of an E2 signal component of the electromagnetic field;
wherein the actuation signal is generated based on detection of the E1 signal component and the E2 signal component.

20. The circuit of claim 1, wherein the detector circuit is configured to detect an electromagnetic field in a frequency range between 100 Hz to 10 GHz.

21. A method of protecting a transformer electrically connected to a power grid, the method comprising:
detecting, via a detection circuit, an electromagnetic field indicating a potential of an electromagnetic event capable of damaging electrical equipment, the electromagnetic field comprising at least one of an E1 or E2 component of an electromagnetic pulse (EMP) signal, and the future electromagnetic event including an E3 component of the electromagnetic pulse signal;
in response to detecting the electromagnetic field at a detection circuit, sending an actuation signal from a controller positioned within a shielded enclosure, the actuation signal triggering a normally-closed switch to an open state, thereby electrically disconnecting the transformer from the power grid prior to arrival of the electromagnetic event capable of damaging electrical equipment.

22. A circuit comprising:
a detector circuit configured to detect an electromagnetic field indicating a potential of a future electromagnetic event capable of damaging electrical equipment connected to a power grid, the electromagnetic field comprising at least one of an E1 or E2 component of an electromagnetic pulse (EMP) signal, and the future electromagnetic event including an E3 component of the electromagnetic pulse signal;
a controller receiving an input from the detector circuit, the controller being included within a shielded enclosure and configured to generate an actuation signal output from the controller to actuate one or more breakers in a region expected to be affected by the future electromagnetic event prior to occurrence of the future electromagnetic event;
wherein actuating the one or more breakers electrically segments the power grid into a plurality of segments, the plurality of segments including a segment including the electrical equipment, the segment being electrically isolated from a remainder of the power grid in response to detection of the electromagnetic field.

23. The circuit of claim 22, wherein the one or more breakers are located at a one or more different power grid substations.

24. The circuit of claim 22, wherein the one or more breakers are electrically connected to one or more power line phases of one or more power lines within the power grid.

25. A method of protecting electrical equipment electrically connected to a power grid, the method comprising:
detecting, via a detection circuit, an electromagnetic field indicating a potential of an electromagnetic event capable of damaging electrical equipment, the electromagnetic field comprising at least one of an E1 or E2 component of an electromagnetic pulse (EMP) signal, and the future electromagnetic event including an E3 component of the electromagnetic pulse signal;
in response to detecting the electromagnetic field at a detection circuit, sending an actuation signal from a controller positioned within a shielded enclosure, thereby electrically disconnecting the electrical equipment from the power grid prior to arrival of the electromagnetic event capable of damaging the electrical equipment.

* * * * *